(12) United States Patent
Nakai et al.

(10) Patent No.: US 9,030,098 B2
(45) Date of Patent: May 12, 2015

(54) WIRELESS ELECTRIC POWER SUPPLY TYPE LIGHT-EMITTING ELEMENT AND LIGHT-EMITTING DEVICE

(75) Inventors: Takahiro Nakai, Ibaraki (JP); Shigenori Morita, Ibaraki (JP); Takezo Hatanaka, Ibaraki (JP); Hisashi Tsuda, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 0 days.

(21) Appl. No.: 14/116,892

(22) PCT Filed: Aug. 3, 2012

(86) PCT No.: PCT/JP2012/069802
§ 371 (c)(1),
(2), (4) Date: Nov. 11, 2013

(87) PCT Pub. No.: WO2013/103028
PCT Pub. Date: Jul. 11, 2013

(65) Prior Publication Data
US 2014/0327356 A1 Nov. 6, 2014

(30) Foreign Application Priority Data
Jan. 5, 2012 (JP) ................................ 2012-000422

(51) Int. Cl.
*H05B 33/08* (2006.01)
*G06K 7/00* (2006.01)
(Continued)

(52) U.S. Cl.
CPC .............. *H05B 33/0896* (2013.01); *G06K 7/00* (2013.01); *H01L 51/5203* (2013.01);
(Continued)

(58) Field of Classification Search
USPC ....................... 313/483–512; 345/76–92, 102, 345/211–214, 204; 257/79–103
See application file for complete search history.

(56) References Cited

U.S. PATENT DOCUMENTS

2006/0214157 A1 9/2006 Kawaguchi et al.
2008/0042558 A1 2/2008 Buchhauser et al.
(Continued)

FOREIGN PATENT DOCUMENTS

JP         2004-5260 A    1/2004
JP      2007-011098 A     1/2007
(Continued)

OTHER PUBLICATIONS

International Search Report for PCT/JP2012/069802, Mailing Date of Nov. 6, 2012.
(Continued)

*Primary Examiner* — Tuyet Vo

(57) ABSTRACT

A wireless electric power supply type light-emitting element 11 of the present invention includes a substrate 2; a light-emitting structure provided on the substrate 2; and a sealing layer 3 provided on the light-emitting structure, wherein the light-emitting structure includes an electric power receiving antenna 4 and an organic electroluminescence element provided on the installation surface of the substrate 2; and two connecting wires 61 and 62 for electrically connecting the electric power receiving antenna 4 and the organic electroluminescence element, the electric power receiving antenna 4 is covered with an insulating layer 7 exclusive of two terminals 41 and 42 of the electric power receiving antenna 4 to which the end parts of the two connecting wires 61 and 62 are connected, and the light-emitting structure is sealed between the substrate 2 and the sealing layer 3.

11 Claims, 5 Drawing Sheets

(51) Int. Cl.
*H01L 51/52* (2006.01)
*H01L 27/32* (2006.01)
*H01L 23/00* (2006.01)
*H05B 33/04* (2006.01)

(52) U.S. Cl.
CPC .......... *H01L 27/3225* (2013.01); *H01L 24/24* (2013.01); *H05B 33/04* (2013.01); *H01L 51/5246* (2013.01); *H01L 2224/82102* (2013.01); *H01L 2224/76155* (2013.01); *H01L 2924/12041* (2013.01)
USPC .............. 313/512; 313/483; 313/491; 257/99; 257/98; 345/204; 345/214

(56) References Cited

U.S. PATENT DOCUMENTS

| | | |
|---|---|---|
| 2011/0210684 A1 | 9/2011 | Lanchava et al. |
| 2011/0237006 A1 | 9/2011 | Sarfert et al. |
| 2012/0007134 A1 | 1/2012 | Miyai et al. |
| 2013/0002041 A1 | 1/2013 | Hatanaka et al. |
| 2014/0151675 A1* | 6/2014 | Saito .............................. 257/40 |

FOREIGN PATENT DOCUMENTS

| | | |
|---|---|---|
| JP | 2007-324598 A | 12/2007 |
| JP | 2010-182098 A | 8/2010 |
| JP | 2010-282490 A | 12/2010 |
| KR | 10-2006-0073514 A | 6/2006 |
| KR | 10-2011-0129442 A | 12/2011 |
| WO | 2011/111585 A1 | 9/2011 |

OTHER PUBLICATIONS

Written Opinion for PCT/JP2012/069802, Mailing Date of Nov. 6, 2012.
Supplementary European Search Report dated Apr. 14, 2014, issued in Corresponding European Patent Application No. 12864206 with European Search Opinion (5 pages).
Communication Pursuant to Article 94(3) EPC dated Mar. 2, 2015, issued in corresponding European Patent Application No. 12864206.3 (5 pages).

\* cited by examiner

WIRELESS ELECTRIC POWER SUPPLY TYPE LIGHT-EMITTING ELEMENT AND LIGHT-EMITTING DEVICE

The present invention relates to a wireless electric power supply type light-emitting element which emits light by receiving supply of electric power via contactless electric power transmission, and a light-emitting device including the wireless electric power supply type light-emitting element.

BACKGROUND ART

Conventionally, there has been known a wireless electric power supply type display device which emits light by receiving electric power that is wirelessly transmitted (Patent Document 1).

Such a wireless electric power supply type display device includes: an electric power transmitter including a carrier high frequency oscillator and an electric power source for driving the oscillator; an antenna which receives a carrier wave transmitted by the electric power transmitter; a receiver including an AC/DC conversion circuit linked to the antenna; and an organic electroluminescence element connected to an output of the receiver.

Hereinafter, organic electroluminescence will be referred to as "organic EL".

In the wireless electric power supply type display device, the organic EL element and the antenna are provided independently, and two electrodes of the organic EL element are electrically connected to the antenna through a connecting wire.

However, the wireless electric power supply type display device in Patent Document 1 has such a problem that the reliability of the device is low because none of a part of the electrode, the antenna and the connecting wire is sealed.

Patent Document 1: JP-A-2007-011098

SUMMARY OF INVENTION

It is an object of the present invention to provide a wireless electric power supply type light-emitting device which emits light stably for a long period of time and has high reliability, and a wireless electric power supply type light-emitting device including the wireless electric power supply type light-emitting element.

The wireless electric power supply type light-emitting element of the present invention includes a substrate; a light-emitting structure provided on the substrate; and a sealing layer provided on the light-emitting structure, wherein the light-emitting structure includes an electric power receiving antenna and an organic electroluminescence element which are provided on the installation surface of the substrate; and two connecting wires for electrically connecting the electric power receiving antenna and the organic electroluminescence element, the organic electroluminescence element includes a first electrode; a second electrode; and an organic layer provided between the first electrode and the second electrode and including a light-emitting layer, the electric power receiving antenna is covered with an insulating layer exclusive of two terminals of the electric power receiving antenna to which the end parts of the two connecting wires are connected, and the light-emitting structure is sealed between the substrate and the sealing layer.

The preferable wireless electric power supply type light-emitting element is that at least one of the two connecting wires provided so as to extend over the upper surface of the insulating layer to the installation surface of the substrate, and the upper surface of the insulating layer on which the connecting wire is provided is an inclined surface inclined with respect to the installation surface, and internal angle formed by the inclined surface and the installation surface is 5 degrees to 60 degrees.

More preferable wireless electric power supply type light-emitting element is that the sealing layer includes a sealing plate which is situated above the light-emitting structure and so arranged as to face the substrate, and a sealing resin which is situated between the substrate and the sealing plate and provided at least at the periphery of the light-emitting structure.

More preferable wireless electric power supply type light-emitting element is that the thickness of the sealing resin exposed to the outside is no more than 1.2 times the thickness of the electric power receiving antenna.

More preferable wireless electric power supply type light-emitting element is that the sealing resin is bonded directly to the upper surface of the substrate at the outside of the periphery of the light-emitting structure.

More preferable wireless electric power supply type light-emitting element is that the sealing plate includes a plate-shaped body facing the substrate and a ring-shaped raised portion projected downward from the peripheral edge part of the plate-shaped body, and the sealing resin is provided between the substrate and the ring-shaped raised portion.

More preferable wireless electric power supply type light-emitting element is that the sealing resin is provided between the substrate and the sealing plate without a gap.

More preferable wireless electric power supply type light-emitting element is that a magnetic layer is provided between the substrate and the electric power receiving antenna.

More preferable wireless electric power supply type light-emitting element is that the substrate includes a metal plate, and a ground insulating layer is provided between the substrate and the organic electroluminescence element.

More preferable wireless electric power supply type light-emitting element is that the connecting wire is formed of a vapor-deposited film.

In another aspect of the present invention, a light-emitting device is provided.

This light-emitting device includes one of the above-mentioned wireless electric power supply type light-emitting element and an electric power transmitter.

A wireless electric power supply type light-emitting element of the present invention can emit light stably for a long period of time.

According to the present invention, there can be provided a wireless electric power supply type light-emitting element and a light-emitting device which have high reliability.

DESCRIPTION OF EMBODIMENTS

Embodiments of the present invention will be described.

Figure 2:
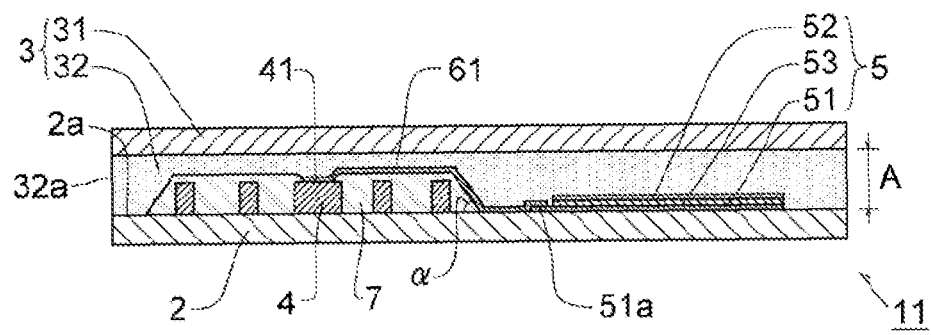
FIG. 2 is a II-II line sectional view of FIG. 1.
Figure 3:
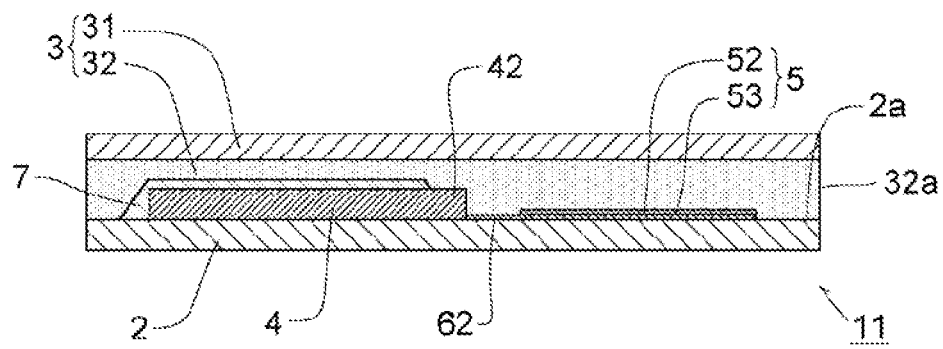
FIG. 3 is a III-III line sectional view of FIG. 1.
Figure 4:
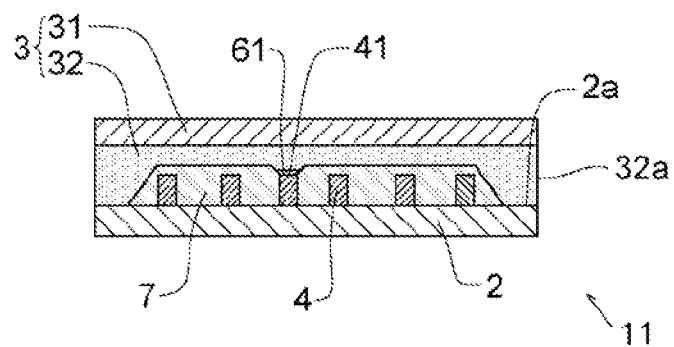
FIG. 4 is a IV-IV line sectional view of FIG. 1.
Figure 5:
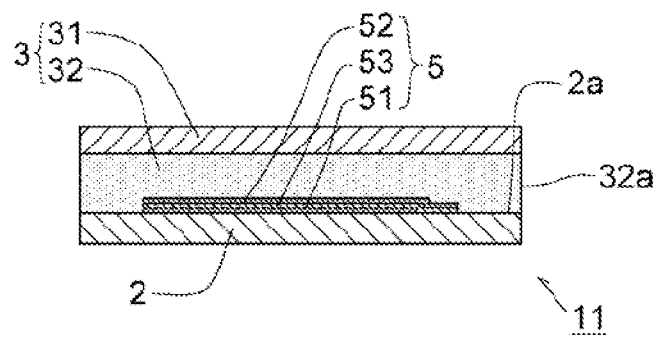
FIG. 5 is a V-V line sectional view of FIG. 1.

It is to be noted that in this specification, terms showing "upward" and "downward" directions are used with reference to a case where a wireless electric power supply type light-emitting element is placed with a substrate facing toward the ground side (lower side on the sheet) and a sealing plate facing toward the ceiling side (upper side on the sheet) (e.g. FIG. 2, etc.).

In this specification, the phrase "PPP to QQQ" means "PPP or more and QQQ or less".

It should be noted that the dimensions of members and parts shown in the figures are different from actual dimensions.

[Wireless Electric Power Supply Type Light-Emitting Element According to First Embodiment]

Figure 1:
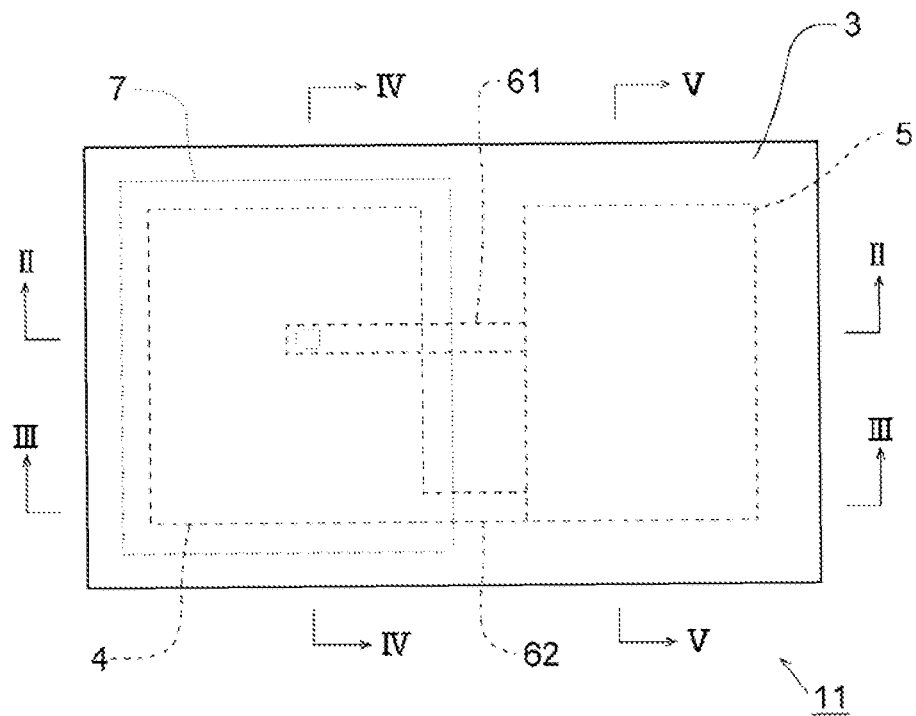
FIG. 1 is a plan view when viewing a wireless electric power supply type light-emitting element according to a first embodiment of the present invention from above.
Figure 6:
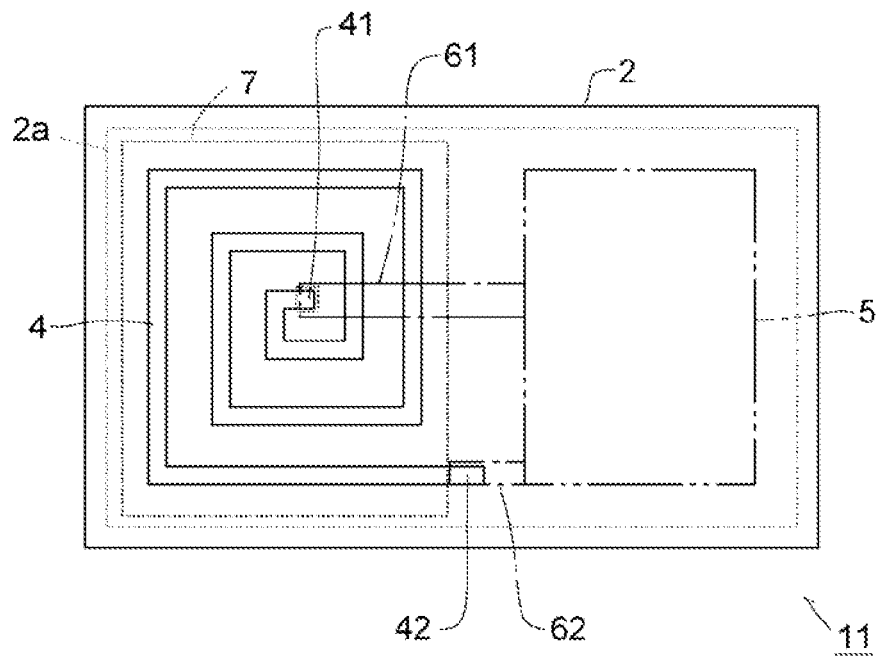
FIG. 6 is a referential plan view showing the shapes and arrangements of a light-emitting structure, an electric power receiving antenna and the like of a wireless electric power supply type light-emitting element.

FIG. 1 is a plan view showing a first embodiment of a wireless electric power supply type light-emitting element of the present invention. FIGS. 2 to 5 are sectional views when cutting the wireless electric power supply type light-emitting element in the thickness directions at various positions. FIG. 6 is a referential plan view showing the shapes and arrangements of a light-emitting structure, an electric power receiving antenna, a connecting wire and an insulating layer of the wireless electric power supply type light-emitting element.

This wireless electric power supply type light-emitting element 11 includes a substrate 2, a light-emitting structure provided on the substrate 2, and a sealing layer 3 provided on the light-emitting structure. The light-emitting structure is sealed between the substrate 2 and the sealing layer 3.

The light-emitting structure includes an electric power receiving antenna 4 and an organic EL element 5 (an organic electroluminescence element) which are provided on the installation surface of the substrate 2, and two connecting wires 61 and 62 for electrically connecting the electric power receiving antenna 4 and the organic EL element 5. The organic EL element 5 includes a first electrode 51, a second electrode 52, and an organic layer 53 provided between the first electrode 51 and the second electrode 52 and containing a light-emitting layer.

The electric power receiving antenna 4 is covered with an insulating layer 7 exclusive of two terminals 41 and 42 of the electric power receiving antenna 4 to which the end parts of the two connecting wires 61 and 62 are connected.

They are specifically described below.

(Substrate)

The substrate 2 is not particularly limited, and examples thereof include such as a glass plate, a metal plate, a film made of synthetic resin, and a ceramic plate.

A material for the metal plate is not particularly limited, and examples thereof include such as aluminum (Al), copper (Cu), stainless (SUS), and silver (Ag).

A material for the film made of synthetic resin is not particularly limited, and examples thereof include such as polyethylene (PE), polypropylene (PP), polycarbonate (PC), polyimide (PI), methacrylic acid resin (PMMA), polyethylene-telephthalate (PET), and cycloolefin resin (COP).

As the substrate 2, a glass plate, a metal plate or a film made of synthetic resin, which has a water vapor barrier property, is preferably used because they are hardly permeable to moisture. Examples of the film made of synthetic resin having a water vapor barrier property include such as a film coated with polyvinylidene chloride, a polyvinylidene chloride film, a high density polyethylene film (HDPE), a polypropylene film, a cyclic olefin based polymer film, an ethylene-propylene copolymer film, and a laminated film including any one of the film mentioned above.

The substrate 2 may be permeable to light, or may be impermeable to light. When the organic EL element 5 is of a bottom emission type, the substrate 2 permeable to light is used. When the organic EL element 5 is of a top emission type, the substrate 2 permeable to light may be used, or the substrate 2 impermeable to light may be used.

The substrate 2 may have flexibility, or may be hard to be bent. When the substrate 2 having flexibility and formed in a long shape is used, the wireless electric power supply type light-emitting element 11 can also be produced by a roll-to-roll method.

The flexibility of the substrate 2 can be adjusted by appropriately designing materials, and thickness of the substrate 2.

The substrate 2 may have electrical conductivity, or may be electrically non-conductive. When the substrate 2 having electrical conductivity (for example, metal plate, or film made of synthetic resin containing electrically conductive fine particles) is used, it is preferred to provide a ground insulating layer on the upper surface of the substrate 2, provide a magnetic layer on the ground insulating layer as necessary, and form the electric power receiving antenna 4 on the magnetic layer for preventing electromagnetic waves of the electric power receiving antenna 4 from being absorbed into the substrate 2.

The substrate 2 is formed in, for example, a rectangular shape as viewed planarly as illustrated.

Here, in this specification, the planarly viewed shape is a shape when viewing the wireless electric power supply type light-emitting element from above in a direction perpendicular to the upper surface thereof as illustrated in FIG. 1. The substrate 2 in the illustrated example has such a size that one light-emitting structure having one electric power receiving antenna 4 and one organic EL element 5 can be included within the surface of the substrate 2.

Of course, the planarly viewed shape of the substrate 2 is not limited to the rectangular shape, and may be a circular shape or the like. The substrate 2 may be formed in a narrow long shape of several tens of meters to several hundreds of meters.

The thickness of the substrate 2 is not particularly limited, and may be appropriately set according to the material. The substrate 2 is a member for preventing ingress of moisture into the light-emitting structure and supporting the light-emitting structure, and therefore if its thickness is too small, the water vapor barrier property and support effect may not be sufficiently exhibited. On the other hand, if the thickness of the substrate 2 is too large, the wireless electric power supply type light-emitting element 11 is upsized. From such point of view, when the substrate 2 is a glass plate, the thickness thereof is preferably 500 μm to 2 mm. When the substrate 2 is a metal plate, the thickness thereof is preferably 10 μm to 500 μm.

(Electric Power Receiving Antenna)

The electric power receiving antenna 4 is provided on the installation surface of the substrate 2. When the electric power receiving antenna 4 is provided directly on the upper surface of the substrate 2, the upper surface of the substrate 2 corresponds to the installation surface, and when any functional layer such as a ground insulating layer is stacked on the upper surface of the substrate 2 and the electric power receiving antenna 4 is provided on the upper surface of the functional layer, the upper surface of the functional layer corresponds to the installation surface.

The material for forming the electric power receiving antenna 4 is not particularly limited, and examples thereof include such as copper, aluminum and silver. The planarly viewed shape of the electric power receiving antenna 4 is not particularly limited, but is generally a wire-wound shape.

The electric power receiving antenna 4 is provided close to one side of the substrate 2. Further, the outer edge of the electric power receiving antenna 4 does not reach the peripheral edge of the substrate 2. That is, the electric power receiving antenna 4 is formed within the surface of the substrate 2.

The electric power receiving antenna 4 is provided with two terminals 41 and 42. The first electrode 51 of the organic EL element 5 is electrically connected to one terminal 41, and the second electrode 52 of the organic EL element 5 is electrically connected to the other terminal 42.

One terminal 41 is located on the central part side of the electric power receiving antenna 4, and the other terminal 42 is located at the outermost part of the electric power receiving antenna 4. In the illustrated example, the other terminal 42 is drawn to the organic EL element 5 side.

The thickness of the electric power receiving antenna 4 is not particularly limited. Of course, if the thickness is too small, carrier wave propagation efficiency becomes low (in other words, loss of carrier waves by resistance is increased), and on the other hand, if the thickness is too large, the wireless electric power type light-emitting element 11 is upsized. From such point of view, the thickness of the electric power receiving antenna 4 is preferably 10 µm to 30 µm, and more preferably 15 µm to 25 µm.

The method for forming the electric power receiving antenna 4 is not particularly limited, and examples thereof include such as a plating method, a printing method and an etching method.

(Organic EL Element)

The organic EL element 5 is provided on the installation surface of the substrate 2. When the organic EL element 5 is provided directly on the upper surface of the substrate 2, the upper surface of the substrate 2 corresponds to the installation surface, and when any functional layer is stacked on the upper surface of the substrate 2 and the organic EL element 5 is provided on the upper surface of the functional layer, the upper surface of the functional layer corresponds to the installation surface.

The organic EL element 5 is provided close to the other side of the substrate 2 at a predetermined distance from the electric power receiving antenna 4. Further, the outer edge of the organic EL element 5 does not reach the peripheral edge of the substrate 2. That is, the electric power receiving antenna 4 is formed within the surface of the substrate 2.

Therefore, a light-emitting structure including the electric power receiving antenna 4, the organic EL element 5, the insulating layer 7, and the connecting wires 61 and 62 is formed within the substrate 2. Thus, a ring-shaped exposed surface 2a, where no light-emitting structure is provided and the upper surface of the substrate 2 is exposed in a ring form, is present at the outside of the periphery of the light-emitting structure.

The organic EL element 5 includes the first electrode 51, the organic layer 53 containing a light-emitting layer, and the second electrode 52 in the ascending order.

A connecting end part 51a for linking the first connecting wire 61 is drawn at one edge of the first electrode 51. Further, a connecting end part for linking the second connecting wire 62 is drawn at one edge of the second electrode 52. Of course, the aforementioned end part may not be drawn from the first electrode 51 or the second electrode 52 when the first connecting wire 61 or the second connecting wire 62 is formed integrally with the first electrode 51 or the second electrode 52.

The first electrode 51 and the second electrode 52 each include a film having electrical conductivity. The first electrode 51 and the second electrode 52 may be an anode and a cathode, respectively, or the first electrode 51 and the second electrode 52 may be a cathode and an anode, respectively.

The material for forming the first electrode 51 and the second electrode 52 is not particularly limited. When the first electrode 51 (or the second electrode 52) is used as an anode, examples of the material for forming the electrode include indium tin oxide (ITO), silicon oxide-containing indium tin oxide (ITSO), gold, platinum, nickel, tungsten, copper, and the like.

On the other hand, the second electrode 52 (or the first electrode 51) is used as a cathode, examples of the material for forming the electrode include aluminum; alkali metal such as lithium and cesium; alkali earth metal such as magnesium and calcium; rare earth metal such as ytterbium; an alloy such as an aluminum-lithium alloy and a magnesium-silver alloy; and the like.

For allowing light from the light-emitting layer to exit to outside, one or both of the first electrode 51 and the second electrode 52 should be permeable to light.

When the organic EL element 5 is of a bottom emission type, an electrode permeable to light is used at least for the first electrode 51. When the organic EL element 5 is of a top emission type, an electrode permeable to light is used at least for the second electrode 52. Examples of the material for forming the electrode permeable to light include a metallic oxide such as ITO and zinc oxide.

The thickness of each of the first electrode 51 and the second electrode 52 is not particularly limited, and they are 10 nm to 20 nm, for example.

The method for forming the first electrode 51 and the second electrode 52 is not particularly limited, and examples thereof include such as a sputtering method, a vapor deposition method and an inkjet method.

The organic layer 53 has at least a hole transport layer, a light-emitting layer and an electron transport layer, and may have a hole injection layer or/and an electron injection layer as necessary.

For example, on the organic layer 53, a hole injection layer, a hole transport layer, a light-emitting layer, an electron transport layer and a electron injection layer are stacked in the ascending order (these layers are not illustrated).

When the first electrode 51 is an anode and the second electrode 52 is a cathode, the aforementioned hole injection layer, hole transport layer, light-emitting layer, electron transport layer and electron injection layer are stacked in order from the first electrode 51 toward the second electrode 52. When the first electrode 51 is a cathode and the second electrode 52 is an anode, the order of stacking the aforementioned hole injection layer, hole transport layer, light-emitting layer, electron transport layer and electron injection layer is reversed.

The material for forming the hole transport layer is not particularly limited as long as it is a material having a hole transport function. Examples of the material for forming the hole transport layer include aromatic amine compounds such as 4,4'-bis[N-(1-naphthyl)-N-phenylamino]biphenyl(NPB) and 4,4'-bis[N-(3-methylphenyl)-N-phenylamino]biphenyl (TPD); carbazole derivatives such as 1,3-bis(N-carbazolyl) benzene; polymer compounds; and the like. The material for forming the hole transport layer may be used alone or in combination of two or more materials. Further, the hole transport layer may have a multilayer structure of two or more layers.

The material for forming a hole injection layer is not particularly limited, and examples thereof include such as metallic oxides such as a vanadium oxide, a niobium oxide, and a tantalum oxide; phthalocyanine compounds such as phthalocyanine; polymer compounds such as a mixture of 3,4-ethylenedioxythiophene and polystyrene sulfonic acid (PEDOT/PSS); the aforementioned material for forming the hole transport layer; and the like. The material for forming a hole injection layer may be used alone or in combination of two or more materials.

The method for forming the hole transport layer and the hole injection layer is not particularly limited, and examples thereof include such as a sputtering method, a vapor deposition method, an inkjet method, and a coating method.

The material for forming the light-emitting layer is not particularly limited as long as it is a material having a light-emitting property. As the material for forming the light-emitting layer, a low-molecular-weight light-emitting material such as a low-molecular-weight fluorescent material or a low-molecular-weight phosphorescent material can be used, for example.

Further, the material for forming the light-emitting layer may have both a light emission function and an electron transport function or hole transport function.

Examples of the low-molecular-weight light-emitting material include aromatic dimethylidene compounds such as 4,4'-bis(2,2'-diphenylvinyl)-biphenyl (DPVBi); oxadiazole compounds such as 5-methyl-2-[2-[4-(5-methyl-2-benzoxazolyl)phenyl]vinyl]benzoxazole; triazole derivatives such as 3-(4-biphenylyl)-4-phenyl-5-t-butylphenyl-1,2,4-triazole; styrylbenzene compounds such as 1,4-bis(2-methylstyryl) benzene; benzoquinone derivatives; naphthoquinone derivatives; anthraquinone derivatives; fluorenone derivatives; and organic metal complexes such as an azomethine-zinc complex and tris(8-quinolinolato) aluminum ($Alq_3$); and the like.

As the material for forming the light-emitting layer, a material doped with a luminous dopant material in a host material may be used.

As the host material, for example, the above described low-molecular-weight light-emitting material can be used, or alternatively carbazole derivatives such as 1,3-bis(N-carbazolyl)benzene (mCP), 2,6-bis(N-carbazolyl)pyridine, 9,9-di (4-dicarbazole-benzyl)fluorene (CPF), and 4,4'-bis(carbazole-9-yl)-9,9-dimethyl-fluorene (DMFL-CBP) can be used.

As the dopant material, for example, styryl derivatives; perylene derivatives; a phosphorescent metal complexes such as organic iridium complexes such as tris(2-phenylpyridyl) iridium (III) ($Ir(ppy)_3$), tris(1-phenylisoquinoline)iridium (III) ($Ir(piq)_3$) can be used.

Moreover, the material for forming the light-emitting layer may contain the material for forming the hole transport layer as described above, the material for forming the electron transport layer as described later, and various kinds of additives.

The material for forming the electron transport layer is not particularly limited as long as it is a material having an electron transport function. Examples of the material for forming the electron transport material include metal complexes such as bis(2-methyl-8-quinolinolato)(4-phenylphenolato)aluminum (BAlq); heteroaromatic compounds such as 2-(4-biphenylyl)-5-(4-tert-butylphenyl)-1,3,4-oxadiazole (PBD) and 1,3-bis[5-(p-tert-butylphenyl)-1,3,4-oxadiazole-2-yl]benzene (OXD-7); and polymer compounds such as poly(2,5-pyridine-diyl) (PPy); and the like. The material for forming the electron transport layer may be used alone or in combination of two or more materials. Further, the electron transport layer may have a multilayer structure of two or more layers.

The material for forming the electron injection layer is not particularly limited, and examples thereof include such as alkali metal compounds such as lithium fluoride (LiF) and cesium fluoride (CsF); alkaline earth metal compounds such as calcium fluoride ($CaF_2$); the material for forming the electron transport layer; and the like. The material for forming the electron injection layer may be used alone or in combination of two or more materials. Further, the electron injection layer may have a multilayer structure of two or more layers.

The method for forming the electron transport layer and the electron injection layer is not particularly limited, and examples thereof include such as a sputtering method, a vapor deposition method, an inkjet method, and a coating method.

(Insulating Layer)

The insulating layer 7 is provided on the electric power receiving antenna 4 so as to cover the electric power receiving antenna 4. Two terminals 41 and 42 of the electric power receiving antenna 4 are not covered by the insulating layer 7.

In the illustrated example, the insulating layer 7 is opened at the central part so that one terminal 41 is exposed.

The planarly viewed shape of the insulating layer 7 is larger than the outer shape of the electric power receiving antenna 4 exclusive of the other terminal 42 of the electric power receiving antenna 4.

The electric power receiving antenna 4 is hermetically sealed between the insulating layer 7 and the substrate 2 exclusive of two terminals 41 and 42.

The peripheral edge of the insulating layer 7 does not reach the peripheral edge of the substrate 2. That is, the insulating layer 7 is formed within the surface of the substrate 2 like the electric power receiving antenna 4 and the organic EL element 5.

The upper surface of the peripheral end part of the insulating layer 7 is an inclined surface inclined with respect to the installation surface of the substrate 2. Preferably the upper surface of the peripheral end part of the insulating layer 7 is an inclined surface that is gradually inclined downward as going outward.

The internal angle $\alpha$ formed by the inclined surface and the installation surface is not particularly limited, and the internal angle $\alpha$ is preferably 5 degrees to 60 degrees, further preferably 10 degrees to 60 degrees, and particularly preferably 20 degrees to 55 degrees. If the internal angle $\alpha$ is smaller than 5 degrees, the formation area of the insulating layer 7 becomes too large, so that the wireless electric power supply type light-emitting element 11 is upsized. If the internal angle $\alpha$ is larger than 60 degrees, the connecting wire 61 may be broken.

The thickness of the electric power receiving antenna 4 is very large as compared to the thickness of the organic EL element 5 (the difference between the thickness of the electric power receiving antenna 4 and the thickness of the organic EL element 5 is normally as large as ten and several μm to several tens of μm). Accordingly, there exists a large level difference between the upper surface of the electric power receiving antenna 4 and the organic EL element 5.

When the internal angle $\alpha$ formed by the upper surface (inclined surface) of the peripheral end part of the insulating layer 7 and the installation surface of the substrate 2 is 60 degrees or less, the bending degree of the connecting wire 61 passing along the upper surface of the insulating layer 7 to be connected to the electrode decreases, so that breakage of the connecting wire 61 can be effectively prevented.

The wireless electric power supply type light-emitting element 11 having such a light-emitting structure can be produced with a low defect rate and a good yield.

In the insulating layer 7 in the illustrated example, the upper surface of its peripheral end part is the inclined surface over the entire periphery, but the entire upper surface of its peripheral end part is not necessarily inclined. For example, the upper surface of a portion of the peripheral end part of the insulating layer 7 may be the inclined surface (not illustrated).

The connecting wire 61 is provided along the upper surface of the substrate 2 from the upper surface of the insulating layer 7. The connecting wire 61 is provided over the terminal 41 of the electric power receiving antenna 4 to the upper surface of the end part of the insulating layer 7 to the installation surface of the substrate 2 in a close contact manner. Since the upper surface of the end part of the insulating layer 7 on which the connecting wire 61 is provided is the inclined surface, breakage of the connecting wire 61 can be effectively prevented.

The material for forming the insulating layer 7 is not particularly limited as long as it has electrical insulating property, and examples thereof include synthetic resins such as a polyimide, an acryl resin, a phenol resin, an epoxy resin and a polyester.

The thickness of the insulating layer 7 is not particularly limited as long as it is larger than the thickness of the electric power receiving antenna 4, but for downsizing the wireless electric power supply type light-emitting element 11, the thickness is preferably no more than 1.15 times the thickness of the electric power receiving antenna 4 (see the following formula 1). Particularly, the thickness of the insulating layer 7 is preferably no more than 1.1 times the thickness of the electric power receiving antenna 4.

$$B < C \leq 1.15B \qquad \text{Formula 1:}$$

In formula 1, C represents the thickness of the insulating layer, and B represents the thickness of the electric power receiving antenna.

The thickness of the insulating layer 7 is preferably the thickness of the electric power receiving antenna 4+500 nm to the thickness of the electric power receiving antenna 4+3000 nm as a specific value.

The thickness of the insulating layer 7 is the longest length between the installation surface of the substrate 2 and the upper surface of the insulating layer 7.

The method for forming the insulating layer 7 is not particularly limited, and examples thereof include such as a photolithography method, a printing method and a resin solution coating method.

(Connecting Wire)

Two connecting wires 61 and 62 are provided (first connecting wire 61 and second connecting wire 62).

The first connecting wire 61 electrically connects one terminal 41 of the electric power receiving antenna 4 and the first electrode 51, and the second connecting wire 62 electrically connects the other terminal 42 of the electric power receiving antenna 4 and the second electrode 52.

One end part of the first connecting wire 61 is bonded to one terminal 41 of the electric power receiving antenna 4, and the other end part of the first connecting wire 61 is bonded to the end part of the first electrode 51. The first connecting wire 61 extends over the upper surface of the end part of the insulating layer 7 to the installation surface of the substrate 2, and is in close contact with these surfaces.

One end part of the second connecting wire 62 is bonded to the other terminal 42 of the electric power receiving antenna 4, and the other end part of the second connecting wire 62 is bonded to the end part of the second electrode 52. The second connecting wire 62 is in close contact with the installation surface of the substrate 2.

In the illustrated example, the second connecting wire 62 is provided on the installation surface of the substrate 2, but when the other terminal 42 of the electric power receiving antenna 4 is not drawn from the peripheral edge of the insulating layer 7, the second connecting wire 62 is provided so as to extend over the upper surface of the insulating layer 7 to the installation surface of the substrate 2 like the first connecting wire 61.

Materials for forming each of the connecting wires 61 and 62 are not particularly limited, and examples thereof include such as a metal such as gold, platinum, copper, aluminum and a magnesium-silver alloy.

The thickness of each of the connecting wires 61 and 62 is not particularly limited, but may be 10 nm to 200 nm.

The method for forming each of the connecting wires 61 and 62 is not limited, and examples thereof include such as a sputtering method and a vapor deposition method.

Preferably the connecting wires 61 and 62 are formed by a vapor deposition method. For the connecting wires 61 and 62 formed of vapor deposited films, the thickness at junctions between the end parts of the connecting wires and terminals 41 and 42 of the electric power receiving antenna 4 or the end parts of electrodes 51 and 52 is not large, and the light-emitting structure can be satisfactorily sealed using the relatively thin sealing layer 3.

Further, by forming the connecting wires 61 and 62 by the vapor deposition method, terminals 41 and 42 of the electric power receiving antenna 4 and the end parts of connecting wires 61 and 62 can be bonded to each other in vacuum without being exposed to air. Thus, rupture at junctions between terminals 41 and 42 of the electric power receiving antenna 4 and the end parts of connecting wires 61 and 62 is hard to occur, so that the wireless electric power supply type light-emitting element 11 that emits light stably for a long period of time can be provided.

Formation of the connecting wires 61 and 62 may be performed in parallel to formation of the first electrode 51 or the second electrode 52, or may be performed independently of formation of the electrodes. When the first connecting wire 61 or the second connecting wire 62 and the electrode are formed in parallel, the first connecting wire 61 or the second connecting wire 62 and the electrode are formed integrally using the same material for forming.

The illustrated example shows a case where the second connecting wire 62 and the second electrode 52 are formed in parallel.

(Sealing Layer)

The sealing layer 3 is a layer for sealing the light-emitting structure in cooperation with the substrate 2. It is to be noted that sealing the light-emitting structure means hermetically sealing the light-emitting structure so as not to expose it to outside air.

The sealing layer 3 is provided on the light-emitting structure.

The sealing layer 3 of this embodiment includes a sealing plate 31 which is situated above the light-emitting structure and so arranged as to face the substrate 2, and a sealing resin 32 which is situated between the substrate 2 and the sealing plate 31 and provided at least at the periphery of the light-emitting structure.

Specifically, the sealing plate 31 is tabular, and is so arranged as to face the substrate 2 with the light-emitting structure held therebetween.

The planarly viewed shape of the sealing plate 31 is normally substantially the same in shape and size as the substrate 2, but the sealing plate 31 may be slightly larger or slightly smaller than the substrate 2.

The sealing resin 32 is filled between the substrate 2 and the sealing plate 31 without a gap in order to fill gaps therebetween.

The sealing plate 31 is not particularly limited, and examples thereof include such as a glass plate, a quartz plate, and a film made of synthetic resin having water vapor barrier properties. Here, the sealing plate 31 may be permeable to light, or may be impermeable to light. When the organic EL element 5 is of a top emission type, the sealing plate 31 permeable to light may be used.

The thickness of the sealing plate 31 is not particularly limited, and may be appropriately set according to the material. If the thickness of the sealing plate 31 is too large, the wireless electric power supply type light-emitting element 11 is upsized. From such point of view, the thickness of the sealing plate 31 is preferably 20 μm to 2 mm, and further preferably 20 μm to 1 mm.

The sealing resin 32 binds the lower surface of the sealing plate 31 with the upper surface of the light-emitting structure and the upper surface of the substrate 2, and shields the light-emitting structure from outside air.

The material for forming the sealing resin 32 is not particularly limited as long as it is a resin capable of being bonded to the light-emitting structure and the sealing plate 31, but above all, a resin having a low moisture absorbency is preferable. Examples of the resin having a low moisture absorbency include solvent-free curable resins and soluble thermoplastic resins. Of course, if the resin having a low moisture absorbency (monomer component or polymer component) contains moisture, the moisture may erode the light-emitting structure, and therefore a water-free or low-water-content resin having a low moisture absorbency is used preferably.

Examples of the resin having a low moisture absorbency include various kinds of epoxy-based resins such as bisphenol A-type, bisphenol F-type, bisphenol S-type, biphenyl-type, naphthalene-type, glycidylamine-type and cycloaliphatic resins.

The sealing resin 32 is provided without a gap between the substrate 2 and the sealing plate 31, including the outside of the periphery of the light-emitting structure.

Therefore, the sealing resin 32 is bonded directly to the ring-shaped exposed surface 2a of the substrate 2, which is present at the outside of the periphery of the light-emitting structure.

By bonding the sealing resin 32 directly to the upper surface (ring-shaped exposed surface 2a) of the substrate 2, ingress of moisture from between the sealing resin 32 and the substrate 2 can be effectively prevented. That is, if any other functional layer lies between the sealing resin 32 and the substrate 2, a risk of penetration of moisture through the interior of the functional layer is increased, or a risk of ingress of moisture from the interface between the functional layer and the sealing resin 32 or the substrate 2 is increased. In this respect, the sealing resin 32 and the upper surface of the substrate 2 are directly bonded to each other, so that ingress of moisture can be effectively prevented.

The outer peripheral end surface 32a of the sealing resin 32 is exposed to the outside (can be in contact with outside air).

The thickness of the sealing resin 32 exposed to the outside (in other words, the thickness of the sealing resin 32 at the outer peripheral end surface 32a) is not particularly limited, but is preferably as small as possible. The thickness of the sealing resin 32 exposed to the outside is denoted by symbol A in FIG. 2.

The sealing resin 32 has a water vapor barrier property, but because of the resin, its water vapor barrier property is generally lower than that of glass and metal. Thus, if the area of the outer peripheral end surface 32a of the sealing resin 32 is too large, a risk of erosion of the light-emitting structure by moisture is accordingly increased, and resultantly the reliability of the wireless electric power supply type light-emitting element 11 is deteriorated. Therefore, the thickness of the sealing resin 32 exposed to the outside is preferably as small as possible.

Preferably, the thickness of the sealing resin 32 exposed to the outside is no more than 1.2 times the thickness of the electric power receiving antenna 4 (see the following formula 2).

$$A \leq 1.2B \qquad \text{Formula 2:}$$

In formula 2, A represents the thickness of the sealing resin 32 exposed to the outside, and B represents the thickness of the electric power receiving antenna 4.

In this embodiment, the lower surface of the sealing plate 31 is flat, and therefore the thickness of the sealing resin 32 exposed to the outside is equal to a distance between the upper surface of the substrate 2 and the lower surface of the sealing plate 31. Thus, in this embodiment, the thickness of the sealing resin 32 exposed to the outside is equal to or more than the thickness of the insulating layer 7 (see the following formula 3).

$$C \leq A \leq 1.2B \qquad \text{Formula 3:}$$

In formula 3, A, B, and C represent the same as those in the formula 1 and 2.

The method for forming the sealing layer 3 is not particularly limited. The sealing layer 3 can be formed by, for example, coating the lower surface of the sealing plate 31 with the sealing resin 32 having a predetermined thickness, placing the coated surface of the sealing resin 32 on the substrate 2, and curing the sealing resin 32.

It is preferred to form the sealing layer 3 under an inert gas atmosphere so as not to take outside air into the sealing resin 32.

In the wireless electric power supply type light-emitting element 11 of the present invention, the entire light-emitting structure including the electric power receiving antenna 4, the organic EL element 5 and connecting wires 61 and 62 is sealed between the substrate 2 and the sealing layer 3. The wireless electric power supply type light-emitting element 11 emits light stably for a long period of time because the organic EL element 5, the electric power receiving antenna 4 and connecting wires 61 and 62 are hard to be eroded by moisture and the like.

Further, the wireless electric power supply type light-emitting element 11 of the present invention can be produced with a good yield because connecting wires 61 and 62 are hard to be broken, and rupture at junctions between terminals 41 and 42 of the electric power receiving antenna 4 and the end parts of connecting wires 61 and 62 is hard to occur.

Therefore, according to the present invention, the wireless electric power supply type light-emitting element 11 having high reliability can be provided.

[Wireless Electric Power Supply Type Light-Emitting Element According to Second Embodiment]

A wireless electric power supply type light-emitting element of a second embodiment is the same as that of the first embodiment except that the sealing layer includes a sealing plate in which a ring-shaped raised portion is provided at the peripheral edge part, and the sealing resin is provided between the substrate and the ring-shaped raised portion with gaps present between the substrate and the sealing plate.

Figure 7:
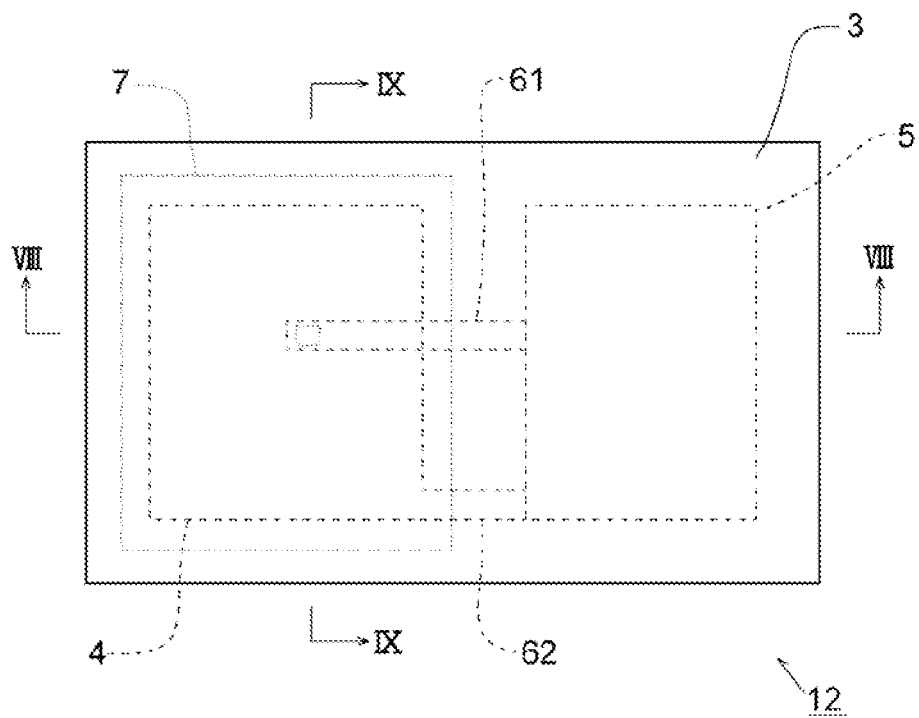
FIG. 7 is a plan view when viewing a wireless electric power supply type light-emitting element according to a second embodiment of the present invention from above.
Figure 8:
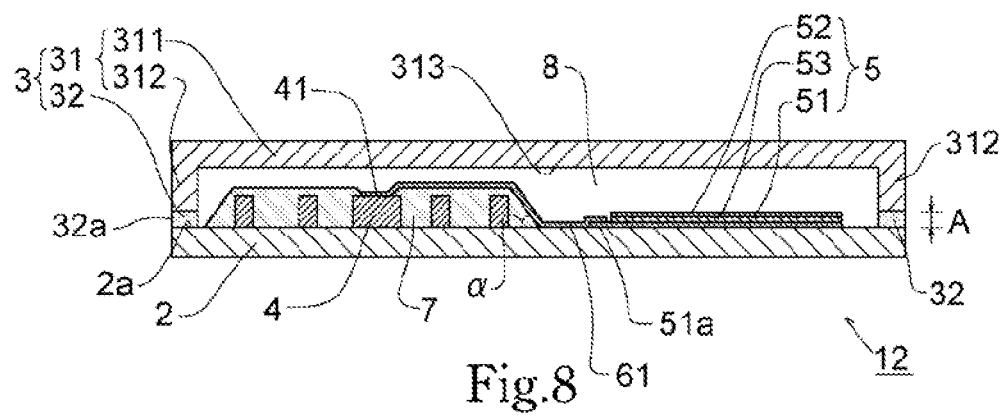
FIG. 8 is a VIII-VIII line sectional view of FIG. 7.
Figure 9:
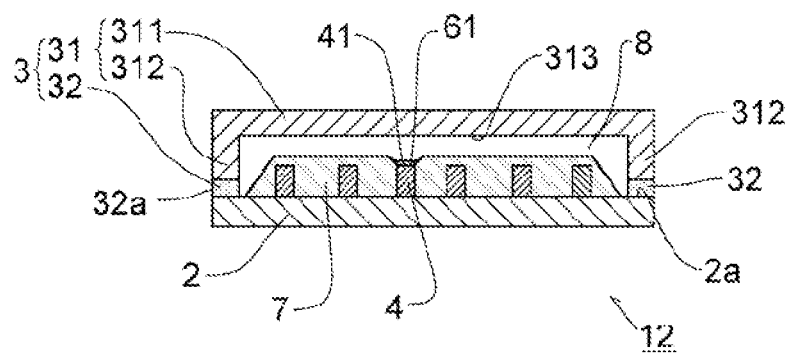
FIG. 9 is a IX-IX line sectional view of FIG. 7.

FIG. 7 is a plan view showing the second embodiment of a wireless electric power supply type light-emitting element of the present invention. FIGS. 8 and 9 are the sectional views when cutting the wireless electric power supply type light-emitting element in the thickness direction. In FIGS. 7 to 9, the same members and parts as in the first embodiment are given the same symbols.

The sealing plate 31 used for the wireless electric power supply type light-emitting element 12 of this embodiment includes a tabular plate-shaped body 311, and a ring-shaped raised portion 312 projected downward from the peripheral edge part of the plate-shaped body 311. The plate-shaped body 311 and the ring-shaped raised portion 312 are formed integrally using the same material for forming. The sealing plate 31 has a recessed portion 313 within an area surrounded by the plate-shaped body 311 and the ring-shaped raised portion 312.

As a material for forming the sealing plate 31, the material shown as an example in the first embodiment can be used.

The projection height of the ring-shaped raised portion 312 is not particularly limited as long as it is larger than the thickness of the insulating layer 7, but if the height is too high, the wireless electric power supply type light-emitting element 11 is upsized. From such point of view, the projection height of the ring-shaped raised portion 312 is preferably more than the thickness of the insulating layer 7 and 2 mm or less, and further preferably more than the thickness of the insulating layer 7 and 1 mm or less.

The width of the ring-shaped raised portion 312 is not particularly limited, but if the width is too small, there is a danger for being damaged, and if the width is too large, the wireless electric power supply type light-emitting element 11 is upsized. From such point of view, the width of the ring-shaped raised portion 312 is preferably 0.5 mm to 3 mm, and more preferably 1 mm to 2.5 mm.

The sealing plate 31 is made to face the substrate 2, and the ring-shaped raised portion 312 of the sealing plate 31 and the peripheral edge part of the substrate 2 are bonded to each other by the sealing resin 32.

As the sealing resin 32, the resin shown as an example in the first embodiment can be used.

The sealing resin 32 is bonded directly to the ring-shaped exposed surface 2a of the substrate 2, which is present at the outside of the periphery of the light-emitting structure. By bonding the sealing resin 32 directly to the upper surface (ring-shaped exposed surface 2a) of the substrate 2, ingress of moisture from between the sealing resin 32 and the substrate 2 can be effectively prevented.

The sealing resin 32 is not filled between the plate-shaped body 311 of the sealing plate 31 and the substrate 2, and therefore a cavity 8 is present between the plate-shaped body 311 of the sealing plate 31 and the substrate 2.

An appropriate amount of a desiccant may be filled in the cavity 8 as necessary. For example, the light-emitting structure is sealed with the sealing plate 31 while the recessed portion 313 of the sealing plate 31 is filled with the desiccant under an inert gas atmosphere. By filling the desiccant, erosion of the light-emitting structure by moisture can be effectively prevented.

The desiccant is not particularly limited, and examples thereof include such as calcium oxide (CaO), silica gel (SiO), zeolite, sodium oxide ($Na_2O$), and sodium sulfate ($Na_2SO_4$).

In this embodiment, the ring-shaped raised portion 312 of the sealing plate 31 is provided so as to face the peripheral edge part of the substrate 2, but the sealing resin 32 lies between the upper surface of the peripheral edge part of the substrate 2 and the lower surface of the ring-shaped raised portion 312 of the sealing plate 31, and the outer peripheral end surface 32a of the sealing resin 32 is exposed to the outside.

The thickness of the sealing resin 32 exposed to the outside is not particularly limited, but is preferably as small as possible for the same reason as that of the first embodiment. The thickness of the sealing resin 32 exposed to the outside is denoted by symbol A in FIG. 8.

For example, in this embodiment, the thickness of the sealing resin 32 exposed to the outside is no more than 1.2 times the thickness of the electric power receiving antenna 4 (the above formula 2).

Of course, in this embodiment using the sealing plate 31 having the ring-shaped raised portion 312, the amount of the sealing resin 32 may be such an amount that the ring-shaped raised portion 312 and the substrate 2 can be bonded to each other. Thus, the thickness of the sealing resin 32 exposed to the outside can be made extremely small.

From such point of view, in this embodiment, the thickness of the sealing resin 32 exposed to the outside can be made 0.01 times to 0.1 times the thickness of the electric power receiving antenna 4.

The other structures and effects are the same as that of the first embodiment, and therefore, the explanation thereof is omitted.

[Wireless Electric Power Supply Type Light-Emitting Element According to Third Embodiment]

A wireless electric power supply type light-emitting element of a third embodiment is the same as that of the first embodiment except that a ground insulating film is provided on the upper surface of the substrate, and a magnetic layer is provided between the ground insulating film and the electric power receiving antenna.

Figure 10:
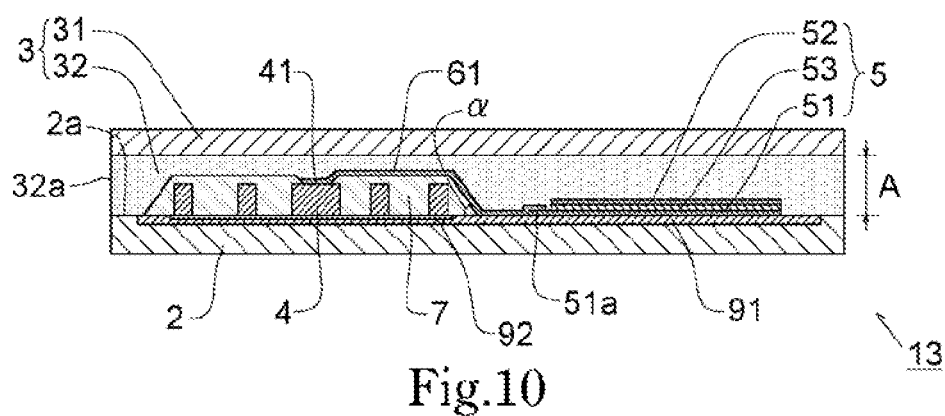
FIG. 10 is a longitudinal sectional view of a wireless electric power supply type light-emitting element according to a third embodiment of the present invention.
Figure 11:
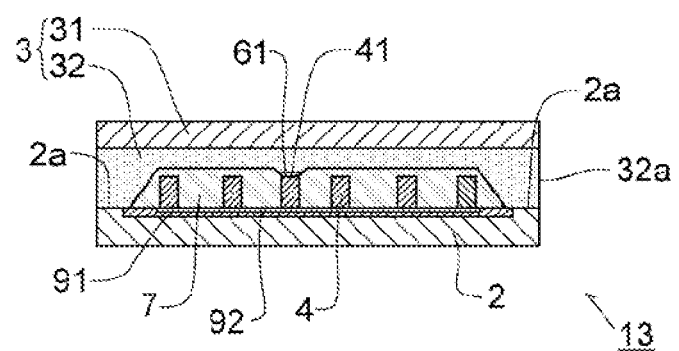
FIG. 11 is a cross sectional view of a wireless electric power supply type light-emitting element according to a third embodiment of the present invention.

FIGS. 10 and 11 are sectional views each showing the third embodiment of the wireless electric power supply type light-emitting element of the present invention. For details, FIG. 10 is a longitudinal sectional view when cutting the wireless electric power supply type light-emitting element of the third embodiment at the same position as that of the II-II line in FIG. 1, and FIG. 11 is a cross sectional view when cutting the wireless electric power supply type light-emitting element of the third embodiment at the same position as that of the IV-IV line in FIG. 1. In FIGS. 10 and 11, the same members and parts as in the first embodiment are given the same symbols.

This embodiment has a structure suitable particularly when the substrate 2 having electrical conductivity is used. However, the structure of this embodiment may be applied to a substrate which does not have electrical conductivity.

In a wireless electric power supply type light-emitting element 13 of this embodiment, a ground insulating layer 91 is provided on the upper surface of the substrate 2. The ground insulating layer 91 may be provided over the entire upper surface of the substrate 2, but the ground insulating layer 91 is provided in an area excluding the peripheral edge part of the substrate 2 for securing a ring-shaped exposed surface 2a where the upper surface of the substrate 2 is exposed in a ring form to the outside of the periphery of a light-emitting structure.

Further, a magnetic layer 92 is provided on the upper surface of the ground insulating layer 91.

The magnetic layer 92 may be provided over the entire upper surface of the ground insulating layer 91, but in the illustrated example, it is provided within an area where an electric power receiving antenna 4 is provided.

Therefore, the ground insulating layer 91 and the magnetic layer 92 lie between the electric power receiving antenna 4 and the substrate 2. The ground insulating layer 91 lies between the light-emitting structure and the substrate 2.

A sealing resin 32 is bonded directly to the ring-shaped exposed surface 2a of the substrate 2 (the upper surface of the substrate 2).

The ground insulating layer 91 is the layer for electrically insulating the substrate 2 having electrical conductivity from the electric power receiving antenna 4 and the light-emitting structure.

As the material and method for forming the ground insulating layer 91, those as described in the above-mentioned insulating layer 7 can be used.

The thickness of the ground insulating layer 91 is not particularly limited, and examples thereof may be 0.5 µm to 5 µm.

The magnetic layer 92 is a layer for preventing carrier waves such as electromagnetic waves received by the electric power receiving antenna 4 from being absorbed into the substrate 2.

Examples of the material for forming the magnetic layer 92 include a resin containing an iron-based magnetic material.

The thickness of the magnetic layer 92 is not particularly limited, and examples thereof may be 10 µm to 100 µm.

The other structures and effects are the same as that of the first embodiment, and therefore, the explanation thereof is omitted.

The sealing layer 3 showing in FIGS. 10 and 11 is the same as that of the first embodiment, but the sealing layer 3 of the third embodiment can be changed to the sealing layer showed in the second embodiment.

[Light-Emitting Device]

A light-emitting device of the present invention includes the above-mentioned wireless electric power supply type light-emitting element and an electric power transmitter.

The electric power transmitter is not particularly limited as long as it can transmit electric power to the wireless electric power supply type light-emitting element in a contactless manner, and a previously known electric power transmitter can be used. Examples of the transmission system of the electric power transmitter include a previously known radio wave system, electromagnetic induction system and electromagnetic field resonance system.

For example, the electric power transmitter includes a high-frequency oscillator, a modulator for high-frequency modulation of a data signal, an electric power amplifier, an output antenna and a battery.

EXAMPLES

Hereinafter, the present invention will be further described by showing Examples. However, the present invention is not limited to Examples described below.

Example 1

A tabular glass plate having a thickness of 0.7 mm, a length of 42 mm and a width of 90 mm was used as a substrate. On the upper surface of the substrate, NiCr in a thickness of 20 nm/Cu in a thickness of 130 nm was formed into a film form (seed layer) by a sputtering method. A negative dry film resist was laminated onto the seed layer, and then exposed to light and processed. By the processing, an exposed part of the seed layer corresponding to the planarly viewed shape of an electric power receiving antenna was formed (i.e. by the processing, a recessed portion corresponding to the planarly viewed shape of the electric power receiving antenna was formed within the surface of the resist). This part was subjected to electrolytic copper plating to deposit Cu at the exposed part of the seed layer until its thickness was 18 µm. In this way, an electric power receiving antenna in a spiral form as viewed planarly, which is formed of Cu in a thickness of 18 µm, was formed.

Next, the dry film resist was peeled off, and further the seed layer excluding a part, on which the electric power receiving antenna (Cu in a thickness of 18 µm) was deposited, was removed by wet etching.

A photosensitive polyimide was applied to an area covering the top of the electric power receiving antenna and having a size larger than the outer shape of the electric power receiving antenna, and dried, and exposed to light and processed. By the processing, the electric power receiving antenna was covered with an insulating layer formed of the polyimide, exclusive of two terminals of the electric power receiving antenna. The insulating layer was pattern-formed so that the upper surface of the peripheral edge part thereof was an inclined surface inclined with respect to the upper surface of the substrate, and the internal angle formed by the upper surface (inclined surface) of the insulating layer and the upper surface of the substrate was 30 degrees.

The thickness of the insulating layer was 19 µm. As the photosensitive polyimide, one having the composition disclosed in JP-B1-3332278 was used.

ITO was formed into a film form in a thickness of 110 nm on the upper surface of the insulating layer and the upper surface of the substrate by a sputtering method. Next, a first electrode composed of ITO was formed on the upper surface of the substrate (on the side of the electric power receiving antenna) by removing ITO by etching, exclusive of a part corresponding to the planar shape of the first electrode having an end part for connecting, then washed and heated.

CuPc was formed into a film form in a thickness of 25 nm on the first electrode as a hole injection layer, NPB was formed into a film form in a thickness of 45 nm on the hole injection layer as a hole transport layer. Alq$_3$ was formed into a film form in a thickness of 60 nm on the hole transport layer as a light-emitting layer also serving as an electron transport layer, and LiF was formed into a film form in a thickness of 0.5 nm on the light-emitting layer as an electron injection layer. The layers ranging from the hole injection layer to the electron injection layer were each formed by carrying out vacuum deposition at a vacuum degree of $10^{-4}$ Pa or lower and at a deposition rate of 1 angstrom/sec.

On the electron injection layer, Al was formed into a film form in a thickness of 100 nm as a second electrode by vacuum deposition. When the second electrode was formed, a first connecting wire for connecting the end part of the first electrode and one terminal of the electric power receiving antenna and a second connecting wire for connecting the end part of the second electrode and the other terminal of the electric power receiving antenna were formed in parallel by aluminum deposition.

In this way, a light-emitting structure including an electric power receiving antenna, an organic EL element, two connecting wires and an insulating layer was prepared on the upper surface of the substrate.

A sealing layer in which one surface of a tabular glass plate (sealing plate) having a thickness of 1.1 mm, a length of 42 mm and a width of 90 mm was coated with a resin material (sealing resin) having a thickness of 20 μm and containing a low-water-content epoxy resin as a main component was superimposed over the light-emitting structure to be bonded thereto.

In this way, a wireless electric power supply type light-emitting element, in which a light-emitting structure was sealed between a substrate and a sealing layer as shown in FIGS. 1 to 5, was prepared.

The thickness of the sealing resin exposed to the outside of the wireless electric power supply type element (symbol A in FIG. 2) was 20 μm.

The sealing resin in Example 1 is bonded directly to the upper surface of the substrate at the outside of the periphery of the light-emitting structure.

Example 2

A light-emitting structure was prepared on the upper surface of the substrate in the same manner as in Example 1.

A sealing plate made of glass, in which a ring-shaped raised portion having a height of 0.4 mm and a width of 2 mm was projected from the peripheral edge part of a plate-shaped body having a thickness of 1.1 mm, a length of 42 mm and a width of 90 mm, was used in place of the sealing layer in Example 1.

The lower surface of the ring-shaped raised portion of the sealing plate was bonded to the peripheral edge part of the substrate while calcium oxide was filled as a desiccant between a recessed portion of the sealing plate and the light-emitting structure under an inert gas atmosphere. For bonding the ring-shaped raised portion of the sealing plate and the substrate, a resin material containing a low-water-content epoxy resin as a main component (same as the resin material in Example 1) was used.

In this way, a wireless electric power supply type light-emitting element, in which the light-emitting structure was sealed between the substrate and the sealing layer as shown in FIGS. 7 to 9, was prepared.

The thickness of the sealing resin exposed to the outside of the wireless electric power supply type light-emitting element (symbol A in FIG. 8) was 6 μm.

The sealing resin in Example 2 is bonded directly to the upper surface of the substrate at the outside of the periphery of the light-emitting structure.

Example 3

A tabular stainless plate having a thickness of 50 μm, a length of 42 mm and a width of 90 mm was used as a substrate. For flattening, an insulating acryl resin (product name "JEM-477" manufactured by JSR Corporation) was applied to the upper surface of the stainless plate excluding the peripheral edge part, and dried to thereby form an acryl resin layer having a thickness of 2 μm.

To a region of the upper surface of the acryl resin layer on which an electric power receiving antenna was to be formed, a solution of a powder of an iron-based magnetic material, polymer components (epoxy resin, phenol resin and acryl rubber; epoxy resin:phenol resin:acryl rubber (mass ratio) =55:35:10) and additives such as a hardening accelerator dissolved in a methyl ethyl ketone solvent was applied to the entire region by a screen printing method, and dried. In this way, a magnetic layer having a thickness of 100 μm as a ground for the electric power receiving antenna was formed.

On the upper surface of the magnetic layer, NiCr in a thickness of 20 nm/Cu in a thickness of 130 nm was deposited as a seed layer by a sputtering method. A negative dry film resist was laminated onto the seed layer, and then exposed to light and processed. By the processing, an exposed part of the seed layer corresponding to the planarly viewed shape of an electric power receiving antenna was formed. This part was subjected to electrolytic copper plating to deposit Cu at the exposed part of the seed layer until its thickness was 18 μm. In this way, an electric power receiving antenna in a spiral form as viewed planarly, which is composed of Cu in a thickness of 18 μm, was formed.

Next, the dry film resist was peeled off, and further the seed layer excluding a part, on which the electric power receiving antenna was deposited, was removed by wet etching.

A photosensitive polyimide was applied to an area covering the top of the electric power receiving antenna and having a size larger than the outer shape of the electric power receiving antenna, and dried, and exposed to light and processed. By the processing, the electric power receiving antenna was covered with an insulating layer composed of polyimide, exclusive of two terminals of the electric power receiving antenna. The insulating layer was pattern-formed so that the upper surface of the peripheral edge part thereof was an inclined surface inclined with respect to the upper surface of the substrate, and the internal angle formed by the upper surface (inclined surface) of the insulating layer and the upper surface of the substrate was 30 degrees.

The thickness of the insulating layer was 20 μm. As the photosensitive polyimide, one having the composition disclosed in JP-B1-3332278 was used.

The substrate on which the insulating layer and the preceding layers were formed was washed and heated.

Al was deposited in a thickness of 100 nm on the upper surface of the substrate as a first electrode, CuPc was deposited in a thickness of 25 nm on the first electrode as a hole injection layer. NPB was deposited in a thickness of 45 nm on the hole injection layer as a hole transport layer. $Alq_3$ was deposited in a thickness of 60 nm on the hole transport layer as a light-emitting layer also serving as an electron transport layer, and LiF was deposited in a thickness of 0.5 nm on the light-emitting layer as an electron injection layer. The layers ranging from the first electrode to the electron injection layer were each formed by carrying out vacuum deposition at a vacuum degree of $10^{-4}$ Pa or lower and at a deposition rate of 1 angstrom/sec.

On the electron injection layer, MgAg was deposited in a thickness of 20 nm as a second electrode by vacuum deposition. When the second electrode was formed, a first connecting wire for connecting the end part of the first electrode and one terminal of the electric power receiving antenna and a second connecting wire for connecting the end part of the second electrode and the other terminal of the electric power receiving antenna were formed in parallel by MgAg deposition.

In this way, a light-emitting structure including an electric power receiving antenna, an organic EL element, two connecting wires and an insulating layer was prepared on the upper surface of the substrate.

Next, a sealing layer in which one surface of a tabular glass plate (sealing plate) having a thickness of 1.1 mm, a length of 42 mm and a width of 90 mm was coated with a resin material (sealing resin) having a thickness of 20 μm and containing a low-water-content epoxy resin as a main component was superimposed over the light-emitting structure to be bonded thereto.

In this way, a wireless electric power supply type light-emitting element, in which the light-emitting structure was sealed between the substrate and the sealing layer as shown in FIGS. 10 and 11, was prepared.

The thickness of the sealing resin exposed to the outside of the wireless electric power supply type light-emitting element (symbol A in FIG. 10) was 20 µm.

The sealing resin in Example 3 is bonded directly to the upper surface of the substrate at the outside of the periphery of the light-emitting structure.

Example 4

A light-emitting structure was prepared on the upper surface of the substrate in the same manner as in Example 3.

A sealing plate made of glass, in which a ring-shaped raised portion having a height of 0.4 mm and a width of 2 mm was projected from the peripheral edge part of a plate-shaped body having a thickness of 1.1 mm, a length of 42 mm and a width of 90 mm, was used in place of the sealing layer in Example 3.

The lower surface of the ring-shaped raised portion of the sealing plate was bonded to the peripheral edge part of the substrate while calcium oxide was filled as a desiccant between a recessed portion of the sealing plate and the light-emitting structure under an inert gas atmosphere. For bonding the ring-shaped raised portion of the sealing plate and the substrate, a resin material containing a low-water-content epoxy resin as a main component (same as the resin material in Example 1) was used.

In this way, a wireless electric power supply type light-emitting element, in which the light-emitting structure was sealed between the substrate and the sealing layer was prepared.

The thickness of the sealing resin exposed to the outside of the wireless electric power supply type light-emitting element was 6 µm.

The sealing resin in Example 4 is bonded directly to the upper surface of the substrate at the outside of the periphery of the light-emitting structure.

Example 5

A wireless electric power supply type light-emitting element was prepared in the same manner as in Example 1 except that the insulating layer was pattern-formed so that the internal angle formed by the upper surface of the insulating layer and the upper surface of the substrate was 50 degrees.

Example 6

A wireless electric power supply type light-emitting element was prepared in the same manner as in Example 1 except that the insulating layer was formed using an insulating acryl resin (product name "JEM-477" manufactured by JSR Corporation) in place of polyimide.

Example 7

A wireless electric power supply type light-emitting element was prepared in the same manner as in Example 1 except that the insulating layer was formed using an insulating acryl resin (product name "JEM-477" manufactured by JSR Corporation) in place of polyimide, and the insulating layer was pattern-formed so that the internal angle formed by the upper surface of the insulating layer and the upper surface of the substrate was 50 degrees.

Comparative Example 1

A wireless electric power supply type light-emitting element was prepared in the same manner as in Example 1 except that a layer, in which one surface of a tabular glass plate (sealing plate) having a thickness of 1.1 mm, a length of 42 mm and a width of 38 mm was coated with a resin material (sealing resin) having a thickness of 20 µm and containing a low-water-content epoxy resin as a main component, was used as a sealing layer, and the organic EL element was sealed with the sealing layer.

That is, in Comparative Example 1, a wireless electric power supply type light-emitting element was prepared in the same manner as in Example 1 except that the electric power receiving antenna and the top of the insulating layer were not sealed with the sealing layer.

Comparative Example 2

A wireless electric power supply type light-emitting element was prepared in the same manner as in Example 2 except that a sealing plate made of glass, in which a ring-shaped raised portion having a height of 0.4 mm and a width of 2 mm was projected from the peripheral edge part of a plate-shaped body having a thickness of 1.1 mm, a length of 42 mm and a width of 38 mm, was used as the sealing plate, and the organic EL element was sealed with this sealing plate.

That is, in Comparative Example 2, a wireless electric power supply type light-emitting element was prepared in the same manner as in Example 2 except that the electric power receiving antenna and the top of the insulating layer were not sealed with the sealing layer.

Comparative Example 3

A wireless electric power supply type light-emitting element was prepared in the same manner as in Example 3 except that a layer, in which one surface of a tabular glass plate (sealing plate) having a thickness of 1.1 mm, a length of 42 mm and a width of 38 mm was coated with a resin material (sealing resin) having a thickness of 20 µm and containing a low-water-content epoxy resin as a main component, was used as a sealing layer, and the organic EL element was sealed with this sealing layer.

That is, in Comparative Example 3, a wireless electric power supply type light-emitting element was prepared in the same manner as in Example 3 except that the electric power receiving antenna and the top of the insulating layer were not sealed with the sealing layer.

Comparative Example 4

A tabular glass plate having a thickness of 0.7 mm, a length of 42 mm and a width of 90 mm was used as a substrate. On the upper surface of the substrate, NiCr in a thickness of 20 nm/Cu in a thickness of 130 nm was formed into a film form as a seed layer by a sputtering method. A negative dry film resist was laminated onto the seed layer, and then exposed to light and processed. By the processing, an exposed part of the seed layer corresponding to the shape of two solder-bonding terminals was formed. This part was subjected to electrolytic copper plating to deposit Cu at the exposed part of the seed layer until its thickness was 18 μm. In this way, two solder-bonding terminals composed of Cu in a thickness of 18 μm were formed.

Next, the dry film resist was peeled off, and further the seed layer excluding a part, on which the two solder-bonding terminals (Cu in a thickness of 18 μm) was deposited, was removed by wet etching.

ITO was deposited in a thickness of 110 nm on the upper surface of the substrate by a sputtering method. Next, ITO was removed by etching, exclusive of a part corresponding to the planar shape of a first electrode having a connecting end part. In this way, a first electrode composed of ITO, which was connected to one of the solder-bonding terminals, was formed on the substrate, then washed and heated.

CuPc was formed into a film form in a thickness of 25 nm on the first electrode as a hole injection layer, NPB was deposited in a thickness of 45 nm on the hole injection layer as a hole transport layer, Alq$_3$ was deposited in a thickness of 60 nm on the hole transport layer as a light-emitting layer also serving as an electron transport layer, and LiF was deposited in a thickness of 0.5 nm on the light-emitting layer as an electron injection layer. The layers ranging from the hole injection layer to the electron injection layer were each formed by carrying out vacuum deposition at a vacuum degree of $10^{-4}$ Pa or lower and at a deposition rate of 1 angstrom/sec.

On the electron injection layer, Al was deposited in a thickness of 100 nm as a second electrode by vacuum deposition. At this time, a second electrode was connected to the other solder-bonding terminal at the same time.

A sealing layer in which one surface of a tabular glass plate (sealing plate) having a thickness of 1.1 mm, a length of 42 mm and a width of 38 mm was coated with a resin material (sealing resin) having a thickness of 20 μm and containing a low-water-content epoxy resin as a main component was superimposed over the organic EL element to be bonded thereto.

In this way, a wired electric power supply type light-emitting element, in which the organic EL element was sealed between the substrate and sealing layer exclusive of two solder-bonding terminals, was prepared.

The thickness of the sealing resin exposed to the outside of the wired electric power supply type light-emitting element was 20 μm.

Comparative Example 5

A wired electric power supply type light-emitting element was prepared in the same manner as in Comparative Example 4 except that a sealing plate made of glass, in which a ring-shaped raised portion having a height of 0.4 mm and a width of 2 mm was projected from the peripheral edge part of a plate-shaped body having a thickness of 1.1 mm, a length of 42 mm and a width of 38 mm, was used, and a sealing layer was formed while the recessed portion of the sealing plate was filled with calcium oxide as a desiccant.

The thickness of the sealing resin exposed to the outside of the wired electric power supply type light-emitting element was 6 μm.

Comparative Example 6

A wired electric power supply type light-emitting element was prepared in the same manner as in Comparative Example 4 except that an acryl resin layer (same as that in Example 3) was formed on the upper surface (except for the peripheral edge part) of a tabular stainless plate having a thickness of 50 μm, a length of 42 mm and a width of 42 mm as a substrate.

Comparative Example 7

A wireless electric power supply type light-emitting element was prepared in the same manner as in Example 1 except that the insulating layer was pattern-formed so that the internal angle formed by the upper surface of the insulating layer and the upper surface of the substrate was 70 degrees.

Comparative Example 8

A wireless electric power supply type light-emitting element was prepared in the same manner as in Example 2 except that the insulating layer was pattern-formed so that the internal angle formed by the upper surface of the insulating layer and the upper surface of the substrate was 70 degrees.

Comparative Example 9

A wireless electric power supply type light-emitting element was prepared in the same manner as in Example 3 except that the insulating layer was pattern-formed so that the internal angle formed by the upper surface of the insulating layer and the upper surface of the substrate was 70 degrees.

Comparative Example 10

A wireless electric power supply type light-emitting element was prepared in the same manner as in Example 4 except that the insulating layer was pattern-formed so that the internal angle formed by the upper surface of the insulating layer and the upper surface of the substrate was 70 degrees.

Comparative Example 11

A wireless electric power supply type light-emitting element was prepared in the same manner as in Example 1 except that the sealing layer was formed so that the thickness of the sealing resin exposed to the outside was 24 μm.

Comparative Example 12

A wireless electric power supply type light-emitting element was prepared in the same manner as in Example 1 except that the sealing layer was formed so that the thickness of the sealing resin exposed to the outside was 30 μm.

Comparative Example 13

A wireless electric power supply type light-emitting element was prepared in the same manner as in Example 3 except that the sealing layer was formed so that the thickness of the sealing resin exposed to the outside was 24 μm.

Comparative Example 14

A wireless electric power supply type light-emitting element was prepared in the same manner as in Example 3 except that the sealing layer was formed so that the thickness of the sealing resin exposed to the outside was 30 μm.

Comparative Example 15

A wireless electric power supply type light-emitting element was prepared in the same manner as in Comparative Example 7 except that the sealing layer was formed so that the thickness of the sealing resin exposed to the outside was 24 μm.

Comparative Example 16

A wireless electric power supply type light-emitting element was prepared in the same manner as in Comparative Example 7 except that the sealing layer was formed so that the thickness of the sealing resin exposed to the outside was 30 μm.

Comparative Example 17

A wireless electric power supply type light-emitting element was prepared in the same manner as in Comparative Example 9 except that the sealing layer was formed so that the thickness of the sealing resin exposed to the outside was 24 μm.

Comparative Example 18

A wireless electric power supply type light-emitting element was prepared in the same manner as in Comparative Example 9 except that the sealing layer was formed so that the thickness of the sealing resin exposed to the outside was 30 μm.

Comparative Example 19

A wireless electric power supply type light-emitting element was prepared in the same manner as in Example 1 except that the insulating layer was pattern-formed so that the internal angle formed by the upper surface of the insulating layer and the upper surface of the substrate was 80 degrees.

Comparative Example 20

A wireless electric power supply type light-emitting element was prepared in the same manner as in Comparative Example 12 except that the insulating layer was pattern-formed so that the internal angle formed by the upper surface of the insulating layer and the upper surface of the substrate was 50 degrees.

Comparative Example 21

A wireless electric power supply type light-emitting element was prepared in the same manner as in Comparative Example 12 except that the insulating layer was pattern-formed so that the internal angle formed by the upper surface of the insulating layer and the upper surface of the substrate was 80 degrees.

Comparative Example 22

A wireless electric power supply type light-emitting element was prepared in the same manner as in Example 6 except that the insulating layer was pattern-formed so that the internal angle formed by the upper surface of the insulating layer and the upper surface of the substrate was 70 degrees.

Comparative Example 23

A wireless electric power supply type light-emitting element was prepared in the same manner as in Example 6 except that the sealing layer was formed so that the thickness of the sealing resin exposed to the outside was 30 μm.

Comparative Example 24

A wireless electric power supply type light-emitting element was prepared in the same manner as in Example 7 except that the sealing layer was formed so that the thickness of the sealing resin exposed to the outside was 30 μm.

Comparative Example 25

A wireless electric power supply type light-emitting element was prepared in the same manner as in Comparative Example 22 except that the sealing layer was formed so that the thickness of the sealing resin exposed to the outside was 30 μm.

Comparative Example 26

A wireless electric power supply type light-emitting element was prepared in the same manner as in Example 3 except that the insulating acryl resin layer was formed on the entire upper surface of the substrate.

In Comparative Example 26, the acryl resin layer lies between the sealing resin and the substrate at the outside of the periphery of the light-emitting structure.

Comparative Example 27

A wireless electric power supply type light-emitting element was prepared in the same manner as in Example 4 except that the insulating acryl resin layer was formed on the entire upper surface of the substrate.

In Comparative Example 27, the acryl resin layer lies between the sealing resin and the substrate at the outside of the periphery of the light-emitting structure.

[Evaluation of Driving of Light-Emitting Element]

For the wireless electric power supply type light-emitting elements of Examples 1 to 7, Comparative Examples 1 to 3 and Comparative Examples 7 to 27, electric power was supplied in the following manner.

An electric power transmission coil was prepared using a stranded wire of copper having an outer diameter of 40 mmϕ and an inner diameter of 10 mmϕ. The electric power transmission coil was arranged so that the distance between the electric power transmission coil and the power receiving antenna of the wireless electric power supply type light-emitting element was 3 mm. Electric power was supplied to the wireless electric power supply type light-emitting element by applying an oscillating frequency of 10 kHz, a voltage of 5 V and a current of 0.6 A to the electric power transmission coil.

For the wired electric power supply type light-emitting element of Comparative Examples 4 to 6, connecting wires linked to the cathode and anode of an external electric power source were soldered to two solder-bonding terminals, respectively, and an electric power of 300 mA was supplied.

Each of the light-emitting elements of Examples and Comparative Examples was placed in a constant-temperature and humidity chamber at 60° C. and 90% RH, and supplied with electric power in the manner described above, so that the light-emitting element was caused to emit light.

A time elapsing until the light emission area becomes 90% when the light emission area at the start of emitting light is 100% (lifetime; unit: hour) was measured. The results are shown in Table 1.

Further, for each of the light-emitting elements of Examples 1 to 4 and Comparative Examples 1 to 6, the front-face brightness (cd/m²) thereof was measured using a light emission efficiency measuring apparatus [product name "EL1003" manufactured by Precisegauge Co., Ltd]. The results are shown in Table 1.

In Table 1, A represents the thickness (μm) of the sealing resin exposed to the outside, and B represents the thickness (μm) of the electric power receiving antenna. "x" for the lifetime in Table 1 means that the element did not emit light.

TABLE 1

| | Sealing with sealing layer | Sealing resin and upper surface of substrate | A (μm) | Relation to thickness of electric power receiving antenna | Inclination angle of insulating layer | Type of supplying electric power | Front-face brightness (cd/m²) | Life time (h) |
|---|---|---|---|---|---|---|---|---|
| Example 1 | Entire light-emitting structure | Bonding directly | 20 | A = 1.11B | 30° | Wireless | 1487 | 1512 |
| Example 2 | Entire light-emitting structure | Bonding directly | 6 | A = 0.33B | 30° | Wireless | 1476 | 1776 |
| Example 3 | Entire light-emitting structure | Bonding directly | 20 | A = 1.11B | 30° | Wireless | 1269 | 1684 |
| Example 4 | Entire light-emitting structure | Bonding directly | 6 | A = 0.33B | 30° | Wireless | 1278 | 1872 |
| Example 5 | Entire light-emitting structure | Bonding directly | 20 | A = 1.11B | 50° | Wireless | — | 1488 |
| Example 6 | Entire light-emitting structure | Bonding directly | 20 | A = 1.11B | 30° | Wireless | — | 1678 |
| Example 7 | Entire light-emitting structure | Bonding directly | 20 | A = 1.11B | 50° | Wireless | — | 1644 |
| Comparative Example 1 | Only organic EL element | Bonding directly | 20 | A = 1.11B | 30° | Wireless | 1472 | 1172 |
| Comparative Example 2 | Only organic EL element | Bonding directly | 6 | A = 0.33B | 30° | Wireless | 1486 | 1268 |
| Comparative Example 3 | Only organic EL element | Bonding directly | 20 | A = 1.11B | 30° | Wireless | 1283 | 740 |
| Comparative Example 4 | Only organic EL element | — | 20 | A = 1.11B | 30° | Wired | 1494 | 1076 |
| Comparative Example 5 | Only organic EL element | — | 6 | A = 0.33B | 30° | Wired | 1488 | 1124 |
| Comparative Example 6 | Only organic EL element | — | 20 | A = 1.11B | 30° | Wired | 1293 | 696 |
| Comparative Example 7 | Entire light-emitting structure | Bonding directly | 20 | A = 1.11B | 70° | Wireless | — | 936 |
| Comparative Example 8 | Entire light-emitting structure | Bonding directly | 6 | A = 0.33B | 70° | Wireless | — | 1044 |
| Comparative Example 9 | Entire light-emitting structure | Bonding directly | 20 | A = 1.11B | 70° | Wireless | — | 956 |
| Comparative Example 10 | Entire light-emitting structure | Bonding directly | 6 | A = 0.33B | 70° | Wireless | — | 944 |
| Comparative Example 11 | Entire light-emitting structure | Bonding directly | 24 | A = 1.33B | 30° | Wireless | — | 984 |
| Comparative Example 12 | Entire light-emitting structure | Bonding directly | 30 | A = 1.67B | 30° | Wireless | — | 886 |
| Comparative Example 13 | Entire light-emitting structure | Bonding directly | 24 | A = 1.33B | 30° | Wireless | — | 1008 |
| Comparative Example 14 | Entire light-emitting structure | Bonding directly | 30 | A = 1.67B | 30° | Wireless | — | 912 |
| Comparative Example 15 | Entire light-emitting structure | Bonding directly | 24 | A = 1.33B | 70° | Wireless | — | 708 |
| Comparative Example 16 | Entire light-emitting structure | Bonding directly | 30 | A = 1.67B | 70° | Wireless | — | 744 |
| Comparative Example 17 | Entire light-emitting structure | Bonding directly | 24 | A = 1.33B | 70° | Wireless | — | 720 |
| Comparative Example 18 | Entire light-emitting structure | Bonding directly | 30 | A = 1.67B | 70° | Wireless | — | 646 |
| Comparative Example 19 | Entire light-emitting structure | Bonding directly | 20 | A = 1.11B | 80° | Wireless | — | X |
| Comparative Example 20 | Entire light-emitting structure | Bonding directly | 30 | A = 1.67B | 50° | Wireless | — | 910 |
| Comparative Example 21 | Entire light-emitting structure | Bonding directly | 30 | A = 1.67B | 80° | Wireless | — | X |
| Comparative Example 22 | Entire light-emitting structure | Bonding directly | 20 | A = 1.11B | 70° | Wireless | — | 1020 |
| Comparative Example 23 | Entire light-emitting structure | Bonding directly | 30 | A = 1.67B | 30° | Wireless | — | 932 |
| Comparative Example 24 | Entire light-emitting structure | Bonding directly | 30 | A = 1.67B | 50° | Wireless | — | 980 |

TABLE 1-continued

|  | Sealing with sealing layer | Sealing resin and upper surface of substrate | A (μm) | Relation to thickness of electric power receiving antenna | Inclination angle of insulating layer | Type of supplying electric power | Front-face brightness (cd/m²) | Life time (h) |
|---|---|---|---|---|---|---|---|---|
| Comparative Example 25 | Entire light-emitting structure | Bonding directly | 30 | A = 1.67B | 70° | Wireless | — | 832 |
| Comparative Example 26 | Entire light-emitting structure | Acryl laser lying in between | 20 | A = 1.11B | 30° | Wireless | — | 1010 |
| Comparative Example 27 | Entire light-emitting structure | Acryl laser lying in between | 20 | A = 1.11B | 30° | Wireless | — | 1036 |

[Evaluation]

From comparison of Examples 1 to 3 with Comparative Examples 1 to 3, it is apparent that a light-emitting element, in which the entire light-emitting structure is sealed with the sealing layer, has high reliability.

From comparison of Examples 3 and 4 with Comparative Examples 26 and 27, it is apparent that a light-emitting element, in which the sealing resin is bonded directly to the upper surface of the substrate at the outside periphery of the light-emitting structure, has high reliability.

From comparison of Examples 1 to 4 with Comparative Examples 11 to 18, 20, 21 and 23 to 25, it is apparent that a light-emitting element, in which the thickness of the sealing resin exposed to the outside is no more than 1.2 times the thickness of the electric power receiving antenna, has high reliability.

From comparison of Examples 1 to 7 with Comparative Examples 7 to 10, 15 to 19, 21, 22 and 25, it is apparent that a light-emitting element, in which the internal angle formed by the inclined surface of the insulating layer and the upper surface of the substrate is roughly 60 degrees or less, has high reliability.

11, 12, 13 Wireless Electric Power Supply Type Light-Emitting Element; 2 Substrate; 3 Sealing Layer; 31 Sealing Plate; 311 Plate-Shaped Body; 312 Ring-Shaped Raised Portion; 32 Sealing Resin; 4 Electric Power Receiving Antenna; 41, 42 Terminal of Electric Power Receiving Antenna; 5 Organic EL element; 51 First Electrode; 52 Second Electrode; 53 Organic Layer; 61, 62 Connecting Wire; 7 Insulating Layer; 91 Ground Insulating Layer; 92 Magnetic Layer

What is claimed is:

1. A wireless electric power supply type light-emitting element comprising a substrate; a light-emitting structure provided on the substrate; and a sealing layer provided on the light-emitting structure,
    wherein the light-emitting structure comprises an electric power receiving antenna and an organic electroluminescence element which are provided on the installation surface of the substrate; and two connecting wires for electrically connecting the electric power receiving antenna and the organic electroluminescence element,
    the organic electroluminescence element comprises a first electrode; a second electrode; and an organic layer provided between the first electrode and the second electrode and including a light-emitting layer,
    the electric power receiving antenna is covered with an insulating layer exclusive of two terminals of the electric power receiving antenna to which the end parts of the two connecting wires are connected, and
    the light-emitting structure is sealed between the substrate and the sealing layer.

2. The wireless electric power supply type light-emitting element according to claim 1,
    wherein at least one of the two connecting wires is provided so as to extend over the upper surface of the insulating layer to the installation surface of the substrate,
    and the upper surface of the insulating layer on which the connecting wire is provided is an inclined surface inclined with respect to the installation surface, and the internal angle formed by the inclined surface and the installation surface is 5 degrees to 60 degrees.

3. The wireless electric power supply type light-emitting element according to claim 1, wherein a magnetic layer is provided between the substrate and the electric power receiving antenna.

4. The wireless electric power supply type light-emitting element according to claim 1, wherein the substrate includes a metal plate, and a ground insulating layer is provided between the substrate and the organic electroluminescence element.

5. The wireless electric power supply type light-emitting element according to claim 1, wherein the connecting wire is formed of a vapor-deposited film.

6. A light-emitting device comprising the wireless electric power supply type light-emitting element according to claim 1; and an electric power transmitter.

7. The wireless electric power supply type light-emitting element according to claim 1, wherein the sealing layer comprises a sealing plate which is situated above the light-emitting structure and so arranged as to face the substrate; and a sealing resin which is situated between the substrate and the sealing plate and provided at least at the periphery of the light-emitting structure.

8. The wireless electric power supply type light-emitting element according to claim 7, wherein the thickness of the sealing resin exposed to the outside is no more than 1.2 times the thickness of the electric power receiving antenna.

9. The wireless electric power supply type light-emitting element according to claim 7, wherein the sealing resin is bonded directly to the upper surface of the substrate at the outside of the periphery of the light-emitting structure.

10. The wireless electric power supply type light-emitting element according to claim 7,
    wherein the sealing plate comprises a plate-shaped body facing the substrate; and a ring-shaped raised portion projected downward from the peripheral edge part of the plate-shaped body, and the sealing resin is provided between the substrate and the ring-shaped raised portion.

11. The wireless electric power supply type light-emitting element according to claim 7, wherein the sealing resin is provided between the substrate and the sealing plate without a gap.

* * * * *